(12) United States Patent
Campbell (10) Patent No.: US 8,467,236 B2
(45) Date of Patent: Jun. 18, 2013

(54) CONTINUOUSLY VARIABLE RESISTOR

(75) Inventor: Kristy A. Campbell, Boise, ID (US)

(73) Assignee: Boise State University, Boise, ID (US)

( * ) Notice: Subject to any disclaimer, the term of this patent is extended or adjusted under 35 U.S.C. 154(b) by 253 days.

(21) Appl. No.: 12/909,760

(22) Filed: Oct. 21, 2010

(65) Prior Publication Data

US 2011/0037558 A1 Feb. 17, 2011

Related U.S. Application Data

(63) Continuation of application No. 12/534,818, filed on Aug. 3, 2009, now Pat. No. 8,238,146.

(60) Provisional application No. 61/137,641, filed on Aug. 1, 2008.

(51) Int. Cl.
*G11C 11/00* (2006.01)

(52) U.S. Cl.
USPC .......................................... 365/159; 365/148

(58) Field of Classification Search
USPC .................................................. 365/148, 159
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |

(Continued)

OTHER PUBLICATIONS

Ande, H.K., "A new approach to the design, fabrication, and testing of chalcogenide-based multi-state phase-change nonvolatile memory", "Circuits and Systems", Aug. 8, 2008, pp. 570-573, Published in: US.

(Continued)

*Primary Examiner* — Hoai V Ho
(74) *Attorney, Agent, or Firm* — Parsons Behle & Latimer (57) ABSTRACT

A continuously variable resistor is disclosed. The continuously variable resistor may comprise a first chalcogenide layer and a second chalcogenide layer. The second chalcogenide layers may be connected to the first chalcogenide layer and may have a metal interspersed within it. The second chalcogenide layer may be metal-rich, in a state of solid solution with the interspersed metal. The continuously variable resistor may be configured to exhibit NDR behavior. The continuously variable resistor may be configured to have three or more substantially non-volatile resistance states.

16 Claims, 6 Drawing Sheets

U.S. PATENT DOCUMENTS

| | | | |
|---|---|---|---|
| 4,673,957 | A | 6/1987 | Ovshinsky et al. |
| 4,678,679 | A | 7/1987 | Ovshinsky |
| 4,696,758 | A | 9/1987 | Ovshinsky et al. |
| 4,698,234 | A | 10/1987 | Ovshinsky et al. |
| 4,710,899 | A | 12/1987 | Young et al. |
| 4,728,406 | A | 3/1988 | Banerjee et al. |
| 4,737,379 | A | 4/1988 | Hudgens et al. |
| 4,766,471 | A | 8/1988 | Ovshinsky et al. |
| 4,769,338 | A | 9/1988 | Ovshinsky et al. |
| 4,775,425 | A | 10/1988 | Guha et al. |
| 4,788,594 | A | 11/1988 | Ovshinsky et al. |
| 4,795,657 | A | 1/1989 | Formigoni et al. |
| 4,800,526 | A | 1/1989 | Lewis |
| 4,809,044 | A | 2/1989 | Pryor et al. |
| 4,818,717 | A | 4/1989 | Johnson et al. |
| 4,843,443 | A | 6/1989 | Ovshinsky et al. |
| 4,845,533 | A | 7/1989 | Pryor et al. |
| 4,847,674 | A | 7/1989 | Sliwa et al. |
| 4,853,785 | A | 8/1989 | Ovshinsky et al. |
| 4,891,330 | A | 1/1990 | Guha et al. |
| 5,128,099 | A | 7/1992 | Strand et al. |
| 5,159,661 | A | 10/1992 | Ovshinsky et al. |
| 5,166,758 | A | 11/1992 | Ovshinsky et al. |
| 5,177,567 | A | 1/1993 | Klersy et al. |
| 5,219,788 | A | 6/1993 | Abernathey et al. |
| 5,238,862 | A | 8/1993 | Blalock et al. |
| 5,272,359 | A | 12/1993 | Nagasubramanian et al. |
| 5,296,716 | A | 3/1994 | Ovshinsky et al. |
| 5,314,772 | A | 5/1994 | Kozicki et al. |
| 5,315,131 | A | 5/1994 | Kishimoto et al. |
| 5,335,219 | A | 8/1994 | Ovshinsky et al. |
| 5,341,328 | A | 8/1994 | Ovshinsky et al. |
| 5,350,484 | A | 9/1994 | Gardner et al. |
| 5,359,205 | A | 10/1994 | Ovshinsky |
| 5,360,981 | A | 11/1994 | Owen et al. |
| 5,363,329 | A | 11/1994 | Troyan |
| 5,406,509 | A | 4/1995 | Ovshinsky et al. |
| 5,414,271 | A | 5/1995 | Ovshinsky et al. |
| 5,500,532 | A | 3/1996 | Kozicki |
| 5,512,328 | A | 4/1996 | Yoshimura et al. |
| 5,512,773 | A | 4/1996 | Wolf et al. |
| 5,534,711 | A | 7/1996 | Ovshinsky et al. |
| 5,534,712 | A | 7/1996 | Ovshinsky et al. |
| 5,536,947 | A | 7/1996 | Klersy et al. |
| 5,543,737 | A | 8/1996 | Ovshinsky |
| 5,591,501 | A | 1/1997 | Ovshinsky et al. |
| 5,596,522 | A | 1/1997 | Ovshinsky et al. |
| 5,687,112 | A | 11/1997 | Ovshinsky |
| 5,694,054 | A | 12/1997 | Ovshinsky et al. |
| 5,714,768 | A | 2/1998 | Ovshinsky et al. |
| 5,726,083 | A | 3/1998 | Takaishi |
| 5,751,012 | A | 5/1998 | Wolstenholme et al. |
| 5,761,115 | A | 6/1998 | Kozicki et al. |
| 5,789,277 | A | 8/1998 | Zahorik et al. |
| 5,814,527 | A | 9/1998 | Wolstenholme et al. |
| 5,818,749 | A | 10/1998 | Harshfield |
| 5,825,046 | A | 10/1998 | Czubatyj et al. |
| 5,841,150 | A | 11/1998 | Gonzalez et al. |
| 5,846,889 | A | 12/1998 | Harbison et al. |
| 5,851,882 | A | 12/1998 | Harshfield |
| 5,869,843 | A | 2/1999 | Harshfield |
| 5,896,312 | A | 4/1999 | Kozicki et al. |
| 5,912,839 | A | 6/1999 | Ovshinsky et al. |
| 5,914,893 | A | 6/1999 | Kozicki et al. |
| 5,920,788 | A | 7/1999 | Reinberg |
| 5,933,365 | A | 8/1999 | Klersy et al. |
| 5,998,066 | A | 12/1999 | Block et al. |
| 6,011,757 | A | 1/2000 | Ovshinsky |
| 6,031,287 | A | 2/2000 | Harshfield |
| 6,072,716 | A | 6/2000 | Jacobson et al. |
| 6,077,729 | A | 6/2000 | Harshfield |
| 6,084,796 | A | 7/2000 | Kozicki et al. |
| 6,087,674 | A | 7/2000 | Ovshinsky et al. |
| 6,117,720 | A | 9/2000 | Harshfield |
| 6,141,241 | A | 10/2000 | Ovshinsky et al. |
| 6,143,604 | A | 11/2000 | Chiang et al. |
| 6,177,338 | B1 | 1/2001 | Liaw et al. |
| 6,236,059 | B1 | 5/2001 | Wolstenholme et al. |
| RE37,259 | E | 7/2001 | Ovshinsky |
| 6,297,170 | B1 | 10/2001 | Gabriel et al. |
| 6,300,684 | B1 | 10/2001 | Gonzalez et al. |
| 6,316,784 | B1 | 11/2001 | Zahorik et al. |
| 6,329,606 | B1 | 12/2001 | Freyman et al. |
| 6,339,544 | B1 | 1/2002 | Chiang et al. |
| 6,348,365 | B1 | 2/2002 | Moore et al. |
| 6,350,679 | B1 | 2/2002 | McDaniel et al. |
| 6,376,284 | B1 | 4/2002 | Gonzalez et al. |
| 6,388,324 | B2 | 5/2002 | Kozicki |
| 6,391,688 | B1 | 5/2002 | Gonzalez et al. |
| 6,404,665 | B1 | 6/2002 | Lowrey et al. |
| 6,414,376 | B1 | 7/2002 | Thakur et al. |
| 6,418,049 | B1 | 7/2002 | Kozicki et al. |
| 6,420,725 | B1 | 7/2002 | Harshfield |
| 6,423,628 | B1 | 7/2002 | Li et al. |
| 6,429,064 | B1 | 8/2002 | Wicker |
| 6,437,383 | B1 | 8/2002 | Xu |
| 6,440,837 | B1 | 8/2002 | Harshfield |
| 6,462,984 | B1 | 10/2002 | Xu et al. |
| 6,469,364 | B1 | 10/2002 | Kozicki |
| 6,473,332 | B1 | 10/2002 | Ignatiev et al. |
| 6,480,438 | B1 | 11/2002 | Park |
| 6,487,106 | B1 | 11/2002 | Kozicki |
| 6,487,113 | B1 | 11/2002 | Park et al. |
| 6,501,111 | B1 | 12/2002 | Lowrey |
| 6,507,061 | B1 | 1/2003 | Hudgens et al. |
| 6,511,862 | B2 | 1/2003 | Hudgens et al. |
| 6,511,867 | B2 | 1/2003 | Lowrey et al. |
| 6,512,241 | B1 | 1/2003 | Lai |
| 6,514,805 | B2 | 2/2003 | Xu et al. |
| 6,531,373 | B2 | 3/2003 | Gill et al. |
| 6,534,781 | B2 | 3/2003 | Dennison |
| 6,545,287 | B2 | 4/2003 | Chiang |
| 6,545,907 | B1 | 4/2003 | Lowrey et al. |
| 6,555,860 | B2 | 4/2003 | Lowrey et al. |
| 6,563,164 | B2 | 5/2003 | Lowrey et al. |
| 6,566,700 | B2 | 5/2003 | Xu |
| 6,567,293 | B1 | 5/2003 | Lowrey et al. |
| 6,569,705 | B2 | 5/2003 | Chiang et al. |
| 6,570,784 | B2 | 5/2003 | Lowrey |
| 6,576,921 | B2 | 6/2003 | Lowrey |
| 6,586,761 | B2 | 7/2003 | Lowrey |
| 6,589,714 | B2 | 7/2003 | Maimon et al. |
| 6,590,807 | B2 | 7/2003 | Lowrey |
| 6,593,176 | B2 | 7/2003 | Dennison |
| 6,597,009 | B2 | 7/2003 | Wicker |
| 6,605,527 | B2 | 8/2003 | Dennison et al. |
| 6,613,604 | B2 | 9/2003 | Maimon et al. |
| 6,621,095 | B2 | 9/2003 | Chiang et al. |
| 6,625,054 | B2 | 9/2003 | Lowrey et al. |
| 6,642,102 | B2 | 11/2003 | Xu |
| 6,646,297 | B2 | 11/2003 | Dennison |
| 6,646,902 | B2 | 11/2003 | Gilton et al. |
| 6,649,928 | B2 | 11/2003 | Dennison |
| 6,667,900 | B2 | 12/2003 | Lowrey et al. |
| 6,671,710 | B2 | 12/2003 | Ovshinsky et al. |
| 6,673,648 | B2 | 1/2004 | Lowrey |
| 6,673,700 | B2 | 1/2004 | Dennison et al. |
| 6,674,115 | B2 | 1/2004 | Hudgens et al. |
| 6,687,153 | B2 | 2/2004 | Lowrey |
| 6,687,427 | B2 | 2/2004 | Ramalingam et al. |
| 6,690,026 | B2 | 2/2004 | Peterson |
| 6,696,355 | B2 | 2/2004 | Dennison |
| 6,707,712 | B2 | 3/2004 | Lowery |
| 6,784,018 | B2 | 8/2004 | Campbell et al. |
| 6,795,338 | B2 | 9/2004 | Parkinson et al. |
| 6,812,087 | B2 | 11/2004 | Giltom et al. |
| 6,813,176 | B2 | 11/2004 | Gilton et al. |
| 6,813,178 | B2 | 11/2004 | Campbell et al. |
| 6,849,868 | B2 | 2/2005 | Campbell |
| 6,856,002 | B2 | 2/2005 | Moore et al. |
| 6,861,367 | B2 | 3/2005 | Gilton et al. |
| 6,864,521 | B2 | 3/2005 | Moore et al. |
| 6,867,064 | B2 | 3/2005 | Campbell et al. |
| 6,867,114 | B2 | 3/2005 | Moore et al. |
| 6,867,996 | B2 | 3/2005 | Campbell et al. |
| 6,881,623 | B2 | 4/2005 | Campbell et al. |
| 6,888,155 | B2 | 5/2005 | Campbell |

| | | | | | | |
|---|---|---|---|---|---|---|
| 6,891,749 B2 | 5/2005 | Campbell et al. | | 2002/0123248 A1 | 9/2002 | Moore et al. |
| 6,912,147 B2 | 6/2005 | Campbell | | 2002/0127886 A1 | 9/2002 | Moore et al. |
| 6,921,912 B2 | 7/2005 | Campbell | | 2002/0132417 A1 | 9/2002 | Li |
| 6,930,909 B2 | 8/2005 | Moore et al. | | 2002/0160551 A1 | 10/2002 | Harshfield |
| 6,943,395 B2 | 9/2005 | Oh et al. | | 2002/0163828 A1 | 11/2002 | Krieger et al. |
| 6,953,720 B2 | 10/2005 | Moore et al. | | 2002/0168820 A1 | 11/2002 | Kozicki et al. |
| 6,955,940 B2 | 10/2005 | Campbell et al. | | 2002/0168852 A1 | 11/2002 | Harshfield et al. |
| 6,956,761 B2 | 10/2005 | Campbell | | 2002/0190289 A1 | 12/2002 | Harshfield et al. |
| 6,961,277 B2 | 11/2005 | Moore et al. | | 2002/0190350 A1 | 12/2002 | Kozicki et al. |
| 6,967,344 B2 | 11/2005 | Ovshinsky et al. | | 2003/0001229 A1 | 1/2003 | Moore et al. |
| 6,998,697 B2 | 2/2006 | Campbell et al. | | 2003/0027416 A1 | 2/2003 | Moore |
| 7,015,494 B2 | 3/2006 | Campbell | | 2003/0032254 A1 | 2/2003 | Gilton |
| 7,018,863 B2 | 3/2006 | Moore et al. | | 2003/0035314 A1 | 2/2003 | Kozicki |
| 7,030,405 B2 | 4/2006 | Campbell | | 2003/0035315 A1 | 2/2003 | Kozicki |
| 7,050,327 B2 | 5/2006 | Campbell | | 2003/0038301 A1 | 2/2003 | Moore |
| 7,056,762 B2 | 6/2006 | Moore et al. | | 2003/0043631 A1 | 3/2003 | Gilton et al. |
| 7,061,004 B2 | 6/2006 | Campbell | | 2003/0045049 A1 | 3/2003 | Campbell et al. |
| 7,064,080 B2 | 6/2006 | Gilton et al. | | 2003/0045054 A1 | 3/2003 | Campbell et al. |
| 7,067,348 B2 | 6/2006 | Campbell et al. | | 2003/0047765 A1 | 3/2003 | Campbell |
| 7,087,454 B2 | 8/2006 | Campbell et al. | | 2003/0047772 A1 | 3/2003 | Li |
| 7,087,919 B2 | 8/2006 | Campbell et al. | | 2003/0047773 A1 | 3/2003 | Li |
| 7,105,864 B2 | 9/2006 | Campbell et al. | | 2003/0048519 A1 | 3/2003 | Kozicki |
| 7,151,273 B2 | 12/2006 | Campbell et al. | | 2003/0048744 A1 | 3/2003 | Ovshinsky et al. |
| 7,153,721 B2 | 12/2006 | Campbell | | 2003/0049912 A1 | 3/2003 | Campbell et al. |
| 7,163,837 B2 | 1/2007 | Moore et al. | | 2003/0068861 A1 | 4/2003 | Li et al. |
| 7,190,048 B2 | 3/2007 | Campbell | | 2003/0068862 A1 | 4/2003 | Li et al. |
| 7,220,982 B2 | 5/2007 | Campbell | | 2003/0095426 A1 | 5/2003 | Hush et al. |
| 7,223,627 B2 | 5/2007 | Moore et al. | | 2003/0096497 A1 | 5/2003 | Moore et al. |
| 7,274,034 B2 | 9/2007 | Campbell et al. | | 2003/0107105 A1 | 6/2003 | Kozicki |
| 7,277,313 B2 | 10/2007 | Campbell et al. | | 2003/0117831 A1 | 6/2003 | Hush |
| 7,282,783 B2 | 10/2007 | Campbell | | 2003/0128612 A1 | 7/2003 | Moore et al. |
| 7,288,784 B2 | 10/2007 | Moore et al. | | 2003/0137869 A1 | 7/2003 | Kozicki |
| 7,289,349 B2 | 10/2007 | Campbell et al. | | 2003/0143782 A1 | 7/2003 | Gilton et al. |
| 7,294,527 B2 | 11/2007 | Campbell et al. | | 2003/0146427 A1 | 8/2003 | Campbell |
| 7,304,368 B2 | 12/2007 | Campbell | | 2003/0155589 A1 | 8/2003 | Campbell et al. |
| 7,315,465 B2 | 1/2008 | Campbell et al. | | 2003/0155606 A1 | 8/2003 | Campbell |
| 7,317,200 B2 | 1/2008 | Campbell | | 2003/0156447 A1 | 8/2003 | Kozicki |
| 7,317,567 B2 | 1/2008 | Campbell | | 2003/0156463 A1 | 8/2003 | Casper et al. |
| 7,326,950 B2 | 2/2008 | Campbell | | 2003/0209728 A1 | 11/2003 | Kozicki et al. |
| 7,329,558 B2 | 2/2008 | Campbell | | 2003/0209971 A1 | 11/2003 | Kozicki |
| 7,332,735 B2 | 2/2008 | Campbell | | 2003/0210564 A1 | 11/2003 | Kozicki |
| 7,344,946 B2 | 3/2008 | Moore et al. | | 2003/0212724 A1 | 11/2003 | Ovshinsky et al. |
| 7,348,205 B2 | 3/2008 | Campbell et al. | | 2003/0212725 A1 | 11/2003 | Ovshinsky et al. |
| 7,348,209 B2 | 3/2008 | Campbell | | 2004/0027849 A1 | 2/2004 | Yang et al. |
| 7,354,793 B2 | 4/2008 | Campbell | | 2004/0035401 A1 | 2/2004 | Ramachandran et al. |
| 7,365,411 B2 | 4/2008 | Campbell | | 2004/0038432 A1 | 2/2004 | Gilton |
| 7,366,030 B2 | 4/2008 | Campbell et al. | | 2004/0042265 A1 | 3/2004 | Moore et al. |
| 7,385,868 B2 | 6/2008 | Moore et al. | | 2004/0202016 A1* | 10/2004 | Campbell ............ 365/159 |
| 7,387,909 B2 | 6/2008 | Campbell | | 2004/0211957 A1 | 10/2004 | Moore et al. |
| 7,393,798 B2 | 7/2008 | Campbell | | 2004/0223390 A1 | 11/2004 | Campbell et al. |
| 7,396,699 B2 | 7/2008 | Campbell et al. | | 2004/0233748 A1 | 11/2004 | Terao et al. |
| 7,433,227 B2 | 10/2008 | Campbell et al. | | 2005/0247927 A1 | 11/2005 | Campbell |
| 7,449,225 B2 | 11/2008 | Nishihara et al. | | 2005/0286294 A1 | 12/2005 | Campbell |
| 7,459,764 B2 | 12/2008 | Moore et al. | | 2006/0035403 A1 | 2/2006 | Campbell |
| 7,491,962 B2 | 2/2009 | Liu et al. | | 2006/0045974 A1 | 3/2006 | Campbell et al. |
| 7,518,212 B2 | 4/2009 | Moore et al. | | 2006/0131555 A1 | 6/2006 | Liu et al. |
| 7,542,319 B2 | 6/2009 | Campbell et al. | | 2007/0145463 A1 | 6/2007 | Campbell |
| 7,550,818 B2 | 6/2009 | Moore et al. | | 2007/0158631 A1 | 7/2007 | Daley et al. |
| 7,579,615 B2 | 8/2009 | Daley et al. | | 2007/0218583 A1 | 9/2007 | Farnworth et al. |
| 7,586,777 B2 | 9/2009 | Campbell | | 2008/0067489 A1 | 3/2008 | Campbell |
| 7,609,563 B2 | 10/2009 | Campbell et al. | | 2008/0121859 A1 | 5/2008 | Campbell |
| 7,619,247 B2 | 11/2009 | Moore et al. | | 2008/0164456 A1 | 7/2008 | Campbell |
| 7,646,007 B2 | 1/2010 | Campbell et al. | | 2008/0185574 A1 | 8/2008 | Campbell et al. |
| 7,659,205 B2 | 2/2010 | Campbell | | 2008/0188034 A1 | 8/2008 | Campbell |
| 7,663,137 B2 | 2/2010 | Campbell | | 2008/0237563 A1 | 10/2008 | Campbell |
| 7,682,992 B2 | 3/2010 | Campbell | | 2009/0124041 A1 | 5/2009 | Liu et al. |
| 7,692,177 B2 | 4/2010 | Moore et al. | | 2010/0027324 A1 | 2/2010 | Campbell |
| 7,701,760 B2 | 4/2010 | Campbell et al. | | | | |
| 7,709,885 B2 | 5/2010 | Daley et al. | | | | |
| 7,723,713 B2 | 5/2010 | Campbell et al. | | | | |
| 7,745,808 B2 | 6/2010 | Campbell | | | | |
| 7,749,853 B2 | 7/2010 | Campbell | | | | |
| 7,759,665 B2 | 7/2010 | Campbell | | | | |
| 7,785,976 B2 | 8/2010 | Campbell | | | | |
| 2002/0000666 A1 | 1/2002 | Kozicki | | | | |
| 2002/0072188 A1 | 6/2002 | Gilton | | | | |
| 2002/0106849 A1 | 8/2002 | Moore | | | | |
| 2002/0123169 A1 | 9/2002 | Moore et al. | | | | |
| 2002/0123170 A1 | 9/2002 | Moore et al. | | | | |

OTHER PUBLICATIONS

Britt et al, "Pulsed and Parallel-Polarization EPR Characterization of the Photosystem II Oxygen-Evolving Complex", "Annual Review of Biophysics and Biomolecular Structure", Jun. 1, 2000, pp. 463-495, vol. 29, Published in: US.

Britt et al, "Recent Pulsed EPR Studies of the Photosystem II Oxygen Evolving Complex: Implications as to Water Oxidation Mechanisms", "Biochimica et Biophysica Acta", Apr. 12, 2004, pp. 158-171, vol. 1655, No. 1-3, Published in: NL.

Campbell, et al, "Dual-Mode EPR Detects the Intial Intermediate in Photoassembly of the Photosystem II Mn Cluster The Influence of Ami", "Journal of the American Chemical Society", Mar. 30, 2000, pp. 3754-3761, vol. 122, No. 15, Published in: US.

Campbell, et al, "Parallel Polarization EPR Detection of an S1-State Multiline EPR Signal in Photosystem II Particles from Synechocystis", "Journal of the American Chemical Society", Jan. 6, 1998, pp. 447-448, vol. 120, No. 2, Published in: US.

Campbell, Kristy A., et al, "Phase-change memory devices with stacked Ge-chalcogenide/Sn-chalcogenide layers", "Microelectronics Journal", Jan. 1, 2007, pp. 52-59, vol. 38, No. 1, Published in: US.

Campbell, "Characterization of Sn, Zn, In, and Sb-containing GeSe alloys for phase-change electronic memory applications", "Materials Research Society Symposium Proceedings ", Apr. 9, 2007, vol. 997, Published in: US.

Campbell, et al, "Chalcogenide bilayer materials used to create multi-state resistance variable devices", "Abstracts, 62nd Northwest Regional Meeting of the American Chemical Society", Jun. 17, 2007, vol. NW-234, Publisher: American Chemical Society, Published in: US.

Campbell et al, "Parallel Polarization EPR Characterization of the Mn(III) Center of Oxidized Manganese Superoxide Dismutase", "Journal of the American Chemical Societ", May 1, 1999, pp. 4714-4715, vol. 121, No. 19, Published in: US.

Campbell et al, "The t-Nitrogen of D2 Histidine 189 is the Hydrogen Bond Donor to the Tyrosine Radical YD of Photosystem II", "J. Am. Chem. Soc", Feb. 25, 1997, pp. 4787-4788, vol. 119, No. 20, Published in: US.

Campbell et al, "Dual-Mode EPR Study of Mn(III) Salen and the Mn(III) Salen-Catalyzed Epoxidation of cis-B- Methylstyrene", "Journal of the American Chemical Society", May 26, 2001, pp. 5710-5719, vol. 123, No. 24, Published in: US.

Campbell et al, "The 23 and 17 kDa Extrinsic Proteins of Photosystem II Modulate the Magnetic Properties of the S1-State Manganese Cluste", "Biochemistry", Mar. 21, 1998, pp. 5039-5045, vol. 37, No. 15, Published in: US.

Campbell et al, "Phase-change memory devices with stacked Ge-chalcogenide/Sn-chalcogenide layers", "Microelectronics Journal", Nov. 14, 2006, pp. 52-59, vol. 38, No. 1, Published in: US.

Davis, et al, "Synthesis and characterization of metal-doped chalcogenide glasses", "Abstracts, 62nd Northwest Regional Meeting of the American Chemical Society", Jun. 17, 2007, vol. NW-039, Publisher: American Chemical Society, Published in: US.

Debus, Richard J., et al, "Does Histidine 332 of the D1 Polypeptide Ligate the Manganese Cluster in Photosystem II? An Electron Spin Echo Envelope ", "Biochemistry", Feb. 27, 2001, pp. 3690-3699, vol. 40, No. 12.

Debus et al, "Does Aspartate 170 of the D1 Polypeptide Ligate the Manganese Cluster in Photosystem II? An EPR and ESEEM Study", "Biochemistry", Aug. 21, 2003, pp. 10600-10608, vol. 42, No. 36, Published in: US.

Debus, Richard J., et al, "Glutamate 189 of the D1 Polypeptide Modulates the Magnetic and Redox Properties of the Manganese Cluster and Tyrosine YZ", "Biochemistry", May 6, 2000, pp. 6275-6287, vol. 39, No. 21, Publisher: American Chemical Society.

Debus, Richard J., et al, "Histidine 332 of the D1 Polypeptide Modulates the Magnetic and Redox Properties of the Manganese Cluster and Tyrosine YZ", "Biochemistry", Dec. 8, 1999, pp. 470-478, vol. 39, No. 2, Publisher: American Chemical Society.

Devasia et al, "Influence of Sn Migration on phase transition in GeTe and Ge2Se3 thin films", "Applied Physics Letters", Apr. 9, 2010, pp. 141908, vol. 96, Published in: US.

Devasia et al, "Analyzing residual stress in bilayer chalcogenide Ge2Se3/SnTe films", "Thin Solid Films", Apr. 8, 2009, pp. 6516-6519, vol. 517, No. 24, Published in: US.

Gupta et al, "W-2W Current Steering DAC for Programming Phase Change Memory", Apr. 3, 2009, pp. 1-4, Publisher: WMED 2009. IEEE Workshop on Apr. 3, 2009, Published in: US.

Campbell et al, "Parallel Polarization EPR Characterization of the Mn(III) Center of Oxidized Manganese Superoxide Dismutase", "Journal of the American Chemical Society", May 1, 1999, pp. 4714-4715, vol. 121, Published in: US.

Peloquin, Jeffrey M. , et al, "55Mn Pulsed ENDOR Demonstrates That the Photosystem II Split EPR Signal Arises from a Magnetically-Coupled Mangano-Tyrosyl Complex", "Journal of the American Chemical Society", Jun. 27, 1998, pp. 6840-6841, vol. 120, No. 27, Publisher: American Chemical Society.

Peloquin, Jeffrey M., et al, "55Mn ENDOR of the S2-State Multiline EPR Signal of Photosystem II Implications on the structure of the Tetranuclear Mn", "Journal of the American Chemical Society", Oct. 21, 2000, pp. 10926-10942, vol. 122, No. 44, Publisher: American Chemical Society.

Rapole et al, "Resistive Memory Sensing Using Delta-Sigma Modulation", Apr. 3, 2009, Publisher: WMED 2009. IEEE Workshop on Apr. 3, 2009, Published in: US.

Regner et al, "Integration of IC Industry Feature Sizes with University Back-End-of-Line Post Processing: Example Using a Phase-Change", Apr. 3, 2009, pp. 1-4, Publisher: WMED 2009. IEEE Workshop on Apr. 3, 2009, Published in: US.

Oblea, Antonio S., et al, "Silver Chalcogenide Based Memristor Devices", Jul. 19, 2010, Publisher: IEEE World Congress on Computational Intelligence.

Oblea et al, "Memristor SPICE Model Simulation & Device Hardware Correlation", May 6, 2010, Publisher: IEEE, Published in: US.

Edwards, Arthur H., et al, "Density Functional Study of Ag in Ge2Se3", Oct. 25, 2009, pp. 1-7, Publisher: Non-Volatile Memory Technology Symposium, Published in: US.

Pino, Robinson E., et al, "Compact Method for Modeling and Simulation of Memristor Devices", Jun. 17, 2010, p. 1-7, Publisher: 2010 IEEE/ACM International Symposium on Nanoscale Architectures (NANOARCH).

Fisher-Colbrie, A.; Bienenstock, A.; Fuoss, P.H.; Marcus, M.A., Structure and Bonding in Photodiffussed Amorphous Ag-GeSe2 Thin Films, Phys. Rev. B 38 (1988) 12388-12403.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

McHardy et al., The Dissolution of Metals in Amorphous Chalcogenides and the Effect of Electron and Ultraviolet Radiation, 20 J. Phys. C.: Solid State Phys., pp. 4055-4075 (1987).

Feng, X. Bresser, W.J.; Boolchand, P., Direct Evidence for Stiffness Threshold in Chalcogenide Glasses, Phys. Rev. Lett. 78 (1997) 4422-4425.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Asahara, Y.; Izumitani, T., Voltage Controlled Switching in Cu-As-Se Compositions, J. Non-Cryst. Solids 11 (1972) 97-104.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P. & W. J. Bresser (2000): The structural origin of broken chemical order in GeSe2 glass, Philosophical Magazine Part B, 80:10, 1757-1772.

Boolchand, P.; Grothaus, J.; Phillips, J.C., Broken Chemical Order and Phase Separation in GexSe1-x Glasses, Solid State Comm. 45 (1983) 183-185.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N. A.; Fadel, M., Conduction Mechanism in the Pre-switching State of Thin Films Containing Te As Ge Si, Vacuum 46 (1995) 701-707.

Fadel, M., Switching Phenomenon in Evaporated Se-Ge-As Thin Films of Amorphous Chalcogenide Glass, Vacuum 44 (1993) 851-855.

Fadel, M.; Ei-Shair, H.T., Electrical, Thermal and Optical Properties of Se75Ge7Sb18, Vacuum 43 (1992) 253-257.

Fleury, G.; Hamou, A.; Viger, C.; Vautier, C., Conductivity and Crystallization of Amorphous Selenium, Phys. Stat. Sol. (a) 64 (1981) 311-316.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hegab, N. A.; Fadel, M.; Sedeek, K., Memory Switching Phenomena in Thin Films of Chalcogenide Semiconductors, Vacuum 45 (1994) 459-462.

Helbert et al., Intralevel Hybrid Resist Process with Submicron Capability, SPIE vol. 333 Submicron Lithography, pp. 24-29 (1982).

Hilt, Dissertation: Materials Characterization of Silver Chalcogenide Programmable Metalization Cells, Arizona State University, pp. Title p. 114 (UMI Company, May 1999).

Hirose et al., High Speed Memory Behavior and Reliability of an Amorphous $As_2S_3$ Film Doped with Ag, Phys. Stat. Sol. (a) 61, pp. 87-90 (1980).

Holmquist et al., Reaction and Diffusion in Silver-Arsenic Chalcogenide Glass Systems, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hu, J.; Hajto, J.; Snell, A.J.; Owen, A.E.; Rose, M.J., Capacitance Anomaly Near the Metal—Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Ilizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., Mechanism of Photosurface Deposition, 164-166 J. Non-Cryst. Solids, pp. 1231-1234 (1993).

Kawamoto, Y., Nishida, M., Ionic Condition in As2S3—Ag2S, GeS2—GeS—Ag2S and P2S5—Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x ($0<=x<=0.571$) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., Lateral Diffusion of Silver in Vitreous Chalcogenide Films, J. Non-Cryst. Solids 137-138 (1991) 1027-1030.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Mazurier, F.; Levy, M.; Souquet, J.L., Reversible and Irreversible Electrical Switching in TeO2-V2O5 Based Glasses, Journal de Physique IV 2 (1992) C2-185-C2-188.

Messoussi, R.; Bernede, J.C.; Benhida, S.; Abachi, T.; Latef, A., Electrical Characterization of M/Se Structures (M=Ni, Bi), Mat. Chem. and Phys. 28 (1991) 253-258.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Ovshinsky S.R.; Fritzsche, H., Reversible Structural Transformations in Amorphous Semiconductors for Memory and Logic, Metalurgical Transactions 2 (1971) 641-645.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Rahman, S.; Sivarama Sastry, G., Electronic Switching in Ge-Bi-Se-Te Glasses, Mat. Sci. and Eng. B12 (1992) 219-222.

Rose,M.J.;Hajto,J.;Lecomber,P.G.;Gage,S.M.;Choi,W.K.;Snell,A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of Non-volatility in a -Si:H Memory Devices, Mat. Res. Soc. Symp. Proc. V 258, 1992, 1075-1080.

Schuocker, D.; Rieder, G., on the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. of Pure and Applied Phys. 35 (1997) 424-427.

Shimizu et al., The Photo-Erasable Memory Switching Effect of Ag Photo-Doped Chalcogenide Glasses, 46 B. Chem Soc. Japan, No. 12, pp. 3662-3665 (1973).

Snell, A.J.; Lecomber, P.G.; Hajto, J.; Rose, M.J.; Owen, A.E.; Osbome, I.S., Analogue Memory Effects in Metal/a-Si: H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120- L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612. David D. Thornburg and Robert M. White.

Titus, S.S.K.; Chatterjee, R.; Asokan, S., Electrical Switching and Short-range Order in As-Te Glasses, Phys. Rev. B 48 (1993) 14650-14652.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.: Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph. D. Dissertation, ASU 1998, 189 pp.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2. 4), J. Non-Cryst. Solids 151 (1992) 149-154.

Tugluoglu, N. et al.—Temperature-dependent barrier characteristics of Ag/P-SnSe Schottky diodes based on I-V-T measurements, Semiconductor Science and Technology, vol. 19, (2004) pp. 1092-1097.

Axon Technologies Corporation, Technology Description: Programmable Metalization Cell (PMC), pp. 1-6 (pre-May 2000) http://www.axontc.com/pmcoverview.htm.

Chinese Office Action with English language translation dated Feb. 6, 2009, corresponding to Chinese Patent Application No. 200680005605.3.

Afifi, M.A., et al; "Electrical & Thermal Conductivity of the Amorphous Semiconductor GexSel-x" Egypt; J. Phys. 17 (1986) 335-342.

Boolchand, P., et al "Onset of Rigidity in Steps in Chalcogenide Glasses, Properties and Applications of Amorphous Materials;" M.F. Thorpe and tichy, L. (eds) Kluwer Academic PUblishers, the Netherlands, 2001, pp. 97-132.

Boolchand, P., Bresser, W.J.; "Compositional Trends in Glass Transition Temperature (Tg), Network Connectivity and Nanoscale Chemical Phase Separation in Chalcogenides;" Dept. of ECECS, Univ. of Cincinnati (Oct. 28, 1999) 45221-0030.

Boolchand, P., Grothaus, J.; "Molecular Structure of Melt-Quenched GeSe2 and GeS2 Glasses Compared;" Proc. Int. Conf. Phys. Semicond. (Eds. Chadi and Harrison) 17.sup.th (1985) 833-36.

Kozicki et al., "Silver Incorporation in Thin Films of Selenium Rich Ge-Se Glasses;" International Congress on Glass, vol. 2, Extended Abstracts, Jul. 2001, pp. 8-9.

Kozicki, "Programmable Metallization Cell Technology Description" Feb. 18, 2000.

Kozicki et al; "Applictions of Programmable Resistance Changes in Metal-doped Chalcogenides;" Electrochemical Society Proceedings, vol. 99-13, 1999, pp. 298-309.

Lakshminarayan, K.N., et al; "Amorphous Semicondcutor Devices: memory and Switching Mechanism;" J. Instn. Electronics & Telecom. Engrs 27 (1981) 16-19.

Owen et al; "Metal-Chalcogenide Photoresists for High Resolution Lithography and Sub-Micron Strucutres;" Nanostructure Physics and Fabrication, pp. 447-451 (M. Reed ed. 1989).

Popescu, C. "The effect of Local Non-uniformities on Thermal Switching and High Field Behavior of Strucutres with Chalcogenide Glasses;" Solid-State Electronics 18 (1975) 671-681.

Tanaka, K., "Ionic and Mixed Conductions in Ag Photodoping Process:" Mod. Phys. Lett B 4 (1990) 1373-1377.

Tranchant, S., et al; "Silver Chalcogenide Glasses Ag-Ge-Se: Ionic Conduction and Exafs Structural Investigation;" Transport-structure Relations in Fast Ion and Mixed Conductors Proceeds of teh 6th Riso International Symposium; Sep. 9-13, 1985; pp. 425-430.

Weirauch, D.F.; "Threshold Switching and Thermal Filaments in Amorphous Semiconductors:" App. Phys. Lett. 16 (1970) 72-73.

Kolobov et al., Photodoping of Amorphous Chalcogenides by Metals, Advances in Physics, 1991, vol. 40, No. 5, pp. 625-684.

Fritzsche, H.; "Optical and Electrical Enegy Gaps in Amorphous Semiconductors;" J. Non-Cryst. Solids 6 (1971) 49-71.

Abdel-All, A.; Elshafie,A.; Elhawary, M.M., DC Electric-field Effect in Bulk and Thin-film Ge5As38Te57 Chalcogenide Glass, Vacuum 59 (2000) 845}853.

Adler, D.; Henisch, H.K.; Mott, S.N., The Mechanism of Threshold Switching in Amorphous Alloy, Rev. Mod. Phys. 50 (1978) 209-220.

Adler, D.; Moss, S.C., Amorphous Memories and Bistable Swithces, J. Vac. Sci. Technol. 9 (1972) 1189.

Angell, C.A., Mobile Ions in Amorphous Solids,Annu. Rev. Phis. Chem. 43 (1992) 693-717.

Aniya, M., Average Electonegativity, Medium-range-order, and Ionic Conductivity in Superionic Glasses, Solid State Ionics 136-137 (2000) 1085-1089.

Asokan, S.; Prasad, M.V.N.; Parthasarathy, G.; Gopal, E.S.R., Mechanical and Chemical Threshold in IV-VI Chalcogenide Glasses, Phys. Rev. Left. 62 (1989) 808-810.

Baranovskii, S.D.; Cordes, H., On the Conduction Mechanism in Ionic Glasses, J. Chem. Phys.111 (1999) 7546-7557.

Belin, R.; Taillades, G.; Pradel, A.; Ribes, M., Ion Dynamics in Superionic Chalcogenide Glasses: completConductivity Spectra, jjSolid State Inonics 136-137 (2000) 1025-1029.

Belin, R,: Zerouale, A,; Pradel, A,; Ribes, M., Iond Dynamics in the Argyrodite Compound ag7GeSe51: Non-Arrhenius Behavior and Complete Conductivity Spectra, Solid State Ionics 143 (2001) 4450455.

Benmore, C.J.; Salmon, P.S., Structure of Fast Ion Conducting and Semiconducting Glassy chalcogenide Alloys, Phys. Rev. Lett. 73 (1994) 264-267.

Boolchand, P.; Bresser, W.J., Mobile Silver Ions and Glass Formatino in Solid Eectrolytes, Nature 410 (2001) 1070-1073.

Boolchand, P,; Georgiev, D.G.; Goodman, B., Discovery of the Intermediate Phase in Chalcogenide Glasses, J. Optoelectronics and Advanced Materials, 3 (2001), 703.

Bresser, W.; Boolchand, P.; Suranyi, P., Rigidity Percolation and Molecular Clustering in Network Glasses, Phys. Rev. Lett. 56 (1986) 2493-2496.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L., Whisker Growth Induced by Ag Photodoping in Glassy GexSe1-x Films, Appl. Phys. Lett. 37 (1980) 1075-1077.

Chen, G.; cheng, J., Role of Nirogen in the Crystallization of Silicon Nitride-doped Chalcogenide Glasses, J. Am. Ceram. Soc. 82 (1999) 2934-2936.

Dalven, R.; Gill, R., Electrical Properties of Beta-Ag2Te and Beta-Ag2Se From 4.2.degree. to 300.degree. K, J. Appl. Phys. 38 (1967) 753-756.

den Boer, W., Threshold Swithcing Hydrogenated Amorphous Silicon, Appl. Phys. Lett. 40 (1982) 812-813.

Drusedau, T.P.; Panckow, A.N.; Klabunde,F., The Hydrogenated Amorphous Silicon/nanodisperse Metal (SIMAL) System-Films of Unique Electronic Properties, J. NonCryst. Solids 198-200 (1996) 829-832.

El-Zahed, H.; El-Korashy, A., Influence of Composition on the Electrical and Optical Properties of Ge20BixSe80-x Films, Thin Solid Films 376 (2000) 236-240.

Hajto, J.; Snell, A.J.; Turvey, K.; Rose, M., DC and AC Measurements on Metal/a=Si:H/metal Room Temperature Quantised Resistance Devices, J. Non-Cryst. Solids 266-269 (2000) 1058-1061.

Hajto, J.; McAuley, B; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hayashi, T,; Ono, Y.; Fukaya, M.; Kan, H., Polarized Memory Switching in Amorphous Se Film, Japan. J. Appl. Phys. 13 (1974) 1163-1164.

Hirose, Y.; hirose, H., Polarity-dependent Memory Switching and Behavior of Ag Dendrite in Ag-photodoped Amorphous As2S3 Films, J. Appl. Phys. 47 (1976) 2767-2772.

Hosokawa, S., Atomic and Electronic Structures of Glassy GexSe1-x Around the Stiffness Threshold Composition, J. Optoelectronics and Advanced Materials 3 (2001) 199-214.

Hu, J.; Hajto, J.; Snell, A.J.; Owen, A.E.; Constant Current Forming in Cr/p+a-Si:h/V Thin Film Devices, J. Non-Cryst. Solids 227-230 (1998) 1187-1191.

Huggett et al., Developement of Silver Sensitized Germanium Selenide Photoresist by Reactive Sputter Etching in SF6, 42 Appl. Phys. Lett., No. 7, pp. 592-594 (Apr. 1983).

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Transmission Spectra Resulting from Ag Photodoping in Chalcogenide Film, Japn, J. Appl. Phys. 26 (1987) 15-21.

Kolobov, A.V., On the Origin of P-type Conductivity in Amorphous Chalcogenides, J. Non-Cryst. Solids 198-200 (1996) 728-731.

Korkinova, Ts.N.; Andreichin, R.E., Chalcogenide Glass Polarization and the Type of Contacts, J. Non-Cryst. Solids 194 (1996) 256-259.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Leung, W,; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effected Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenuum Thin films, Jpn. J. Appl. Phys. 11 (1972) 606.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, m.; Boolchand, P., Microscopic Origin of the Glass Forming Tendency in Chalcohalides and Constraint Theory, J. Non-Cryst. Solids 240 (1998) 1-21.

Mitkova, M.; Wang, Y.; Boolchand, P., Dual Chemical Role of Ag as an Additive in Chalcogenide Glasses, Phys. Rev. Lett. 83 (1999) 3848-3852.

Nakayama, k.; Kitagawa, T.; Ohmura, M,; Suzuki, M., Nonvolatile Memory Based on phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcongenide Network Glasses, Phys. Rev. B 54 (1996) 4413-4415.

Neale, R.G,; Aseltine, J.A., The Application of Amorphous Materials to Computer Memories, IEEE Transactions on Electon Dev. Ed-20 (1973) 195-209.

Ovshinsky, S.R., Reversible Electical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically programmable Nonvolatile Switching Device, IEE Proc. 129 (1982) 51-54.

Owen, A.E.; Le Comber, P.G.; Hajto, J.; Rose, M.J.; Snell, A.J., Switching in Amorphous Devices, Int. J. Electronics 73 (1992) 897-906.

Pattanayak, P.; Asokan, S., Signature of a Silver Phase Percolation Threshold in Microscopically phase Separated Ternary Ge$_{o.15}$Se$_{0.85-x}$Ag$_x$ ($0.1 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switchingin Thin Films of the Chalcogenide System Ge-As-Se, Appl. Phys. Lett. 19 (1971) 221-223.

Prakash, S.; Asokan, S.; Ghare, D.B., Easily Reversible Memory Switching in Ge-As-Te Glasses, J. Phys. D: Appl. Phys. 29 (1996) 2004-2008.

Ramesh, K.; Asokan, S.; Sangumni, K.S.; Gopal, E.S.R., Electrical Switching in Germanium Telluride Glasses Doped with Cu and Ag, Appl. Phys. A 69 (1999) 421-425.

Tichy, L.; Ticha, H., Remark on the Glass-forming Ability in GexSel-x and AsxSel-x Systems, J. Non-Cryst. Solids 261 (2000) 277-281.

Fritzsche, H, Optical and Electrical Energy Gaps in Amophous Semiconductors, J. Non-Cryst. Solids 6 (1971) 49-71.

Gates, B.; Wu, Y.; Yin, Y.; Yang, P.; Xia, Y., Single-crystalline Nanowires of Ag2Se can be Synthesized by Templating Against Nanowires of Trigonal Se, J. Am. Chem. Soc. (2001) Currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002).

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

\* cited by examiner

CONTINUOUSLY VARIABLE RESISTOR

CROSS REFERENCE TO RELATED APPLICATION

The present application claims the benefit of and is a continuation of U.S. patent application Ser. No. 12/534,818, filed on Aug. 3, 2009 which issued as U.S. Pat. No. 8,238,146 on Aug. 7, 2012 and is entitled "Variable Integrated Analog Resistor", which claims the benefit of U.S. Provisional Patent Application No. 61/137,641, entitled "Variable Integrated Analog Resistor" and filed on Aug. 1, 2008, the disclosures of which are each incorporated herein by reference in their entireties.

BACKGROUND

This disclosure relates generally to resistors that may be used in electrical circuits, and more specifically to resistors with a range of discrete resistance states. Also, this disclosure pertains to electrically programmable analog variable resistors and circuits using devices exhibiting electrically programmable, analog resistances.

Typically, in an integrated circuit, resistors are fabricated by doping a material, such as silicon, with another material, such as phosphorus or boron, to a level that achieves a suitable resistance value in the material. The resistance of a device fabricated from this material is generally static in the final integrated circuit. Another way of achieving a suitable resistance value in an integrated circuit is by biasing a transistor, such as a MOSFET, at certain conditions specific to the transistor. For example, a MOSFET may be operated in the triode region to achieve a specific resistance. Unlike a passive resistor, actively biasing a transistor requires constant power. Neither technique makes it possible to create a range of available resistance states that retain their state in the absence of an applied electrical signal, during normal operation of an integrated circuit.

Chalcogenide glasses containing an excess of metal, have been shown to exhibit negative differential resistance (NDR). In this context, NDR is the same as differential negative resistance (DNR)—referred to in the prior art. U.S. Pat. Nos. 7,329,558, 7,050,327, and 7,015,494 describe devices displaying NDR/DNR, using these devices in binary electronic memory, and as an analog memory via the current value read at the NDR peak. In the prior art, the NDR device is formed by addition of an excess of metal ions in a chalcogenide glass by either heating a chalcogenide material layered with a metal layer or by application of a fast electrical pulse with pulse width and amplitude specific to the chalcogenide material type. The peak current is programmed by application of a pulse of duration and amplitude that can cause the peak current to be either reduced or increased. The device current is read at or near the voltage corresponding to the peak current value.

NDR devices can be fabricated with standard complementary metal-oxide semiconductor (CMOS) processes at sizes consistent with the state of the art feature sizes, thus integrating well with existing and future integrated circuit technologies. Conventional chalcogenide devices may be comprised of $Ge_xSe_{1-x}$, wherein $0 \leq x \leq 0.9$. Some chalcogenide devices contain copper and/or silver and/or mixtures thereof. For example, chalcogenide devices may comprise a combination of $(Ge_xSe_{1-x})_yCu_{1-y}$ and $(Ge_xSe_{1-x})_yAg_{1-y}$, wherein $0 \leq x \leq 0.9$ and wherein $0.1 \leq y \leq 0.9$. Some chalcogenide devices are of a single layer of chalcogenide material containing an excess of metal which causes the NDR response.

Chalcogenide materials have also been explored for creating phase change devices. Phase change devices take advantage of a property of some chalcogenide materials that allows some or all of the material to be physically changed between crystalline or amorphous states. By changing the physical structure of a chalcogenide, one or more electrically measureable parameters of the material, such as the resistance, may change.

Ion-conduction through chalcogenide material is also known. A voltage pulse may be applied to an ion conduction device to move metal into a chalcogenide material, forming a continuous and conductive path of metal through the chalcogenide material (i.e., forming a relatively low resistance state). The resistance of the conductive path can be altered repeatedly.

SUMMARY

A continuously variable resistor is disclosed. The continuously variable resistor may comprise a first chalcogenide layer and a second chalcogenide layer connected to the first chalcogenide layer. The second chalcogenide layer may have a metal interspersed within it and may be in the form of a solid solution. The second chalcogenide layer may be metal rich. The continuously variable resistor may be configured to exhibit NDR behavior.

The continuously variable resistor may be configured to have two or more resistance states. The continuously variable resistor may be configured to have three or more resistance states. Each resistance state may have a resistance value. The resistance value for each state may be substantially non-volatile. The first chalcogenide layer may comprise $Ge_2Se_3$. The second chalcogenide layer may comprise $Ge_2Se_3$. Metal interspersed within the second chalcogenide layer may comprise lead, tin, silver, indium, antimony, gold, or copper. The second chalcogenide layer may consist of $Ge_2Se_3$. Metal interspersed within the second chalcogenide layer may consist of silver.

A method of programming a continuously variable resistor is disclosed. The method may comprise configuring the continuously variable resistor to have a negative differential resistance behavior, applying a first voltage pulse to the continuously variable resistor to change the resistance state of the continuously variable resistor from the first resistance state to a second resistance state, and applying a second voltage pulse to the continuously variable resistor to change the resistance state of the continuously variable resistor from the second resistance state to a third resistance state. The continuously variable resistor may comprise a first chalcogenide layer connected to a second chalcogenide layer. The continuously variable resistor may have a resistance value that is variable. The continuously variable resistor may be set to a first resistance state. The second chalcogenide layer may have a metal interspersed within it. The second chalcogenide layer may be a metal-rich chalcogenide layer.

The method of programming a continuously variable resistor may further comprise measuring the resistance value of the continuously variable resistor a first time, prior to applying the first voltage pulse. The method may further comprise adjusting the first voltage pulse prior to applying the first voltage pulse. The adjustment may be at least partly based on the first measured resistance value of the continuously variable resistor. The adjustment to the first voltage pulse may comprise a change in the voltage amplitude. The adjustment to the first voltage pulse may comprise a change in the length of the voltage pulse. The method may further comprise measuring the resistance value of the continuously variable resistor a second time, prior to applying the second voltage pulse. The second measurement may be subsequent to applying the first voltage pulse. The method may further comprise adjusting the second voltage pulse prior to applying the second voltage pulse, at least partly based on the second measured resistance value of the continuously variable resistor. A positive voltage pulse may increase the resistance value of the continuously variable resistor. A positive voltage pulse may decrease the resistance value of the continuously variable resistor.

A method of programming a circuit element is disclosed. The method may comprise configuring a continuously variable resistor to have a negative differential resistance behavior, applying a plurality of discrete voltage pulses to the continuously variable resistor to change the resistance state of the continuously variable resistor from the first resistance state to a second resistance state. The continuously variable resistor may comprise a first chalcogenide layer connected to a second chalcogenide layer. The continuously variable resistor may have a resistance value that is variable. The continuously variable resistor may be set to a first resistance state. The second chalcogenide layer may have a metal interspersed within it. The second chalcogenide layer may be a metal-rich chalcogenide layer.

The method may further comprise measuring the resistance value of the continuously variable resistor after applying each discrete voltage pulse. The method may further comprise selecting one or more parameters of a subsequent discreet voltage pulse. The measurement of the resistance value may be used in the selection of one or more parameters of the subsequent discrete voltage pulse. Configuring a continuously variable resistor may comprise applying a voltage pulse to the continuously variable resistor.

DETAILED DESCRIPTION

In the following description, reference is made to the accompanying drawings that form a part thereof, and in which is shown, by way of illustration, specific exemplary embodiments in which the invention may be practiced. These embodiments are described in sufficient detail to enable those skilled in the art to practice the invention, and it is to be understood that modifications to the various disclosed embodiments may be made, and other embodiments may be utilized, without departing from the spirit and scope of the present disclosure. The following detailed description is, therefore, not to be taken in a limiting sense.

The term "substrate" used in the following description may include any supporting structure including, but not limited to, a semiconductor substrate that has an exposed substrate surface. A semiconductor substrate should be understood to include silicon, epitaxial silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate in the following description, previous process steps may have been utilized to form regions or junctions in or over the base substrate or foundation. The substrate need not be semiconductor-based, but may be any support structure suitable for supporting the disclosed device, including, but not limited to, metals, alloys, glasses, natural and synthetic polymers, ceramics, fabrics, and any other suitable materials, as would be apparent to one of ordinary skill in the art, given the benefit of this disclosure.

A chalcogen is generally represented on the periodic table of elements in Group 16, which comprises, among other elements, sulfur (S), selenium (Se), and tellurium (Te). A chalcogenide is generally a compound with an element from the chalcogen group and an electropositive element, such as, for example, cadmium (Cd), germanium (Ge), lead (Pb), tin (Sn), or copper (Cu). Metal chalcogenides are a subset of chalcogenides and are generally made up of a compound with an element from the chalcogen group and a metal, such as, for example, lead (Pb), tin (Sn), silver (Ag), indium (In), antimony (Sb), gold (Au), copper (Cu), or another suitable metal. A metal-rich chalcogenide, as distinct from a metal chalcogenide, is generally a chalcogenide with metal interspersed into the chalcogenide, forming at least in part a solid solution rather than a completely new chemical compound. For example, a metal-rich chalcogenide material may comprise $Ge_2Se_3$ and a metal such as Ag and may be notated as $Ge_2Se_3$:Ag.

Figure 3:
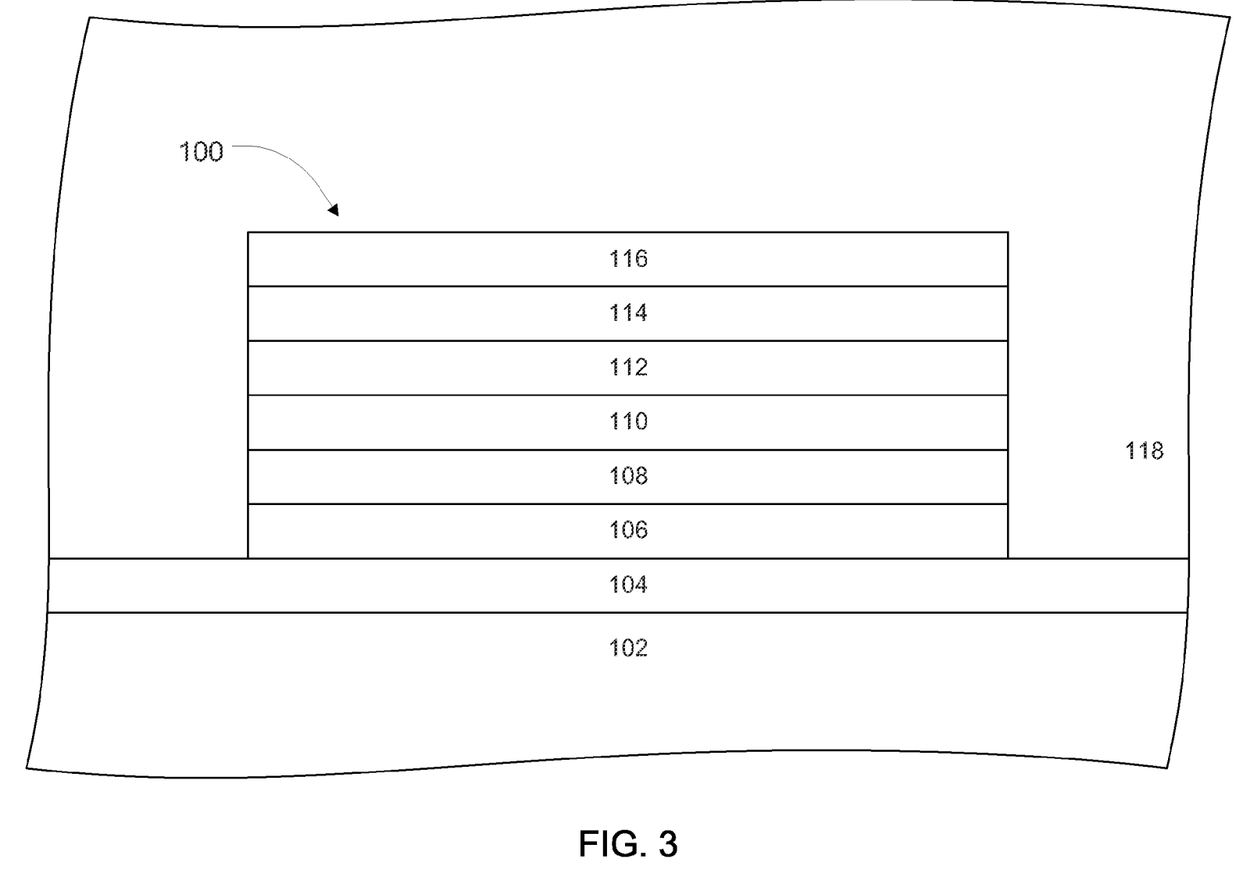
FIG. 3 is cutaway view of an embodiment of a continuously variable resistor.

FIG. 3 is a cross-sectional view of an embodiment of a continuously variable resistor ("CVR") 100, such as might be fabricated on a first insulative layer 104 of a substrate 102, such as a semiconductor wafer. The CVR 100 comprises a first conductor 106, a first chalcogenide layer 108, a second chalcogenide layer 110, a metal layer 112, an adhesive layer 114, and a second conductor 116. The CVR 100 is further encapsulated by a second insulative layer 118. One or more of the layers may be optional. For example, the adhesion layer 114 may not be needed to adhere the conductor 116 to the metal layer 112. Also, additional layers may be added in between one or more of the layers. For example, additional adhesion layers may be added between one or more layers.

The first insulative layer 104 may be fabricated over the substrate 102 and may comprise one or more materials, such as an oxide material, a nitride material, or another suitable insulative material, as would be apparent to one of ordinary skill in the art, given the benefit of this disclosure. The first insulative layer 104 may be fabricated on the substrate 102 through processing steps known in the art. Alternatively, first insulative layer 104 may be omitted and the layers of the CVR 100 may be fabricated directly on the substrate 102.

The first conductor 106 may be fabricated on the first insulative layer 104. The first conductor 106 may comprise tungsten (W), or another suitable conductive material. The first conductor 106 may connect to further conductive elements or circuitry, such as a voltage plane, a ground plane, a voltage supply, a driver circuit, a difference amplifier, a sense amplifier, or other suitable circuitry.

In some embodiments, the first chalcogenide layer 108 may be fabricated on the first conductor 106 and may be fabricated to a suitable thickness, such as about 300 angstroms. The first chalcogenide layer 108 may comprise $Ge_xSe_{(100-x)}$ (e.g. germanium selenide) where x may be in the range of about 18 to about 40, such as 20, 25, or 40. For example, the first chalcogenide layer 108 may comprise $Ge_{40}Se_{60}$, which may also be expressed as $Ge_2Se_3$. Alternatively, the first chalcogenide layer 108 may comprise, for example, $Ge_xS_{(100-x)}$ (e.g., germanium sulfide), or other suitable elements.

In some embodiments, the second chalcogenide layer 110 may be fabricated over the first chalcogenide layer 108 and may be fabricated to a suitable thickness, such as about 500 angstroms. The second chalcogenide layer 110 may comprise $Ge_xSe_{(100-x)}$ (e.g. germanium selenide) where x may be in the range of about 18 to about 40, such as 20, 25, or 40. For example, the first chalcogenide layer 108 may comprise $Ge_{40}Se_{60}$, which may also be expressed as $Ge_2Se_3$. Alternatively, the second chalcogenide layer 110 may comprise, for example, $Ge_xS_{(100-x)}$ (e.g., germanium sulfide), or other suitable elements.

Metal may be interspersed within the second chalcogenide layer 110 to make it metal-rich at the time of fabrication, such as, for example, by sputtering metal into the second chalcogenide layer 110 during deposition. Additionally or alternatively, metal may be interspersed within the second chalcogenide layer 110 after the CVR 100 has been fabricated, such as by annealing or by applying one or more voltage pulses to the CVR 100.

In some embodiments, the metal layer 112 may be fabricated over the second chalcogenide layer 110 and may be fabricated to a suitable thickness, such as about 150 angstroms. In some embodiments, the metal layer 112 may be omitted. For example, the metal layer 112 may be omitted in embodiments of a CVR 100 that incorporate metal into the second chalcogenide layer 110 at the time of fabrication. Alternatively, the metal layer 112 may be fabricated over the second chalcogenide layer 110 in addition to the incorporation of metal into the second chalcogenide layer 110 at the time of fabrication.

The second conductor 116 may be fabricated directly on the metal layer 112. Alternatively, the second conductor 116 may connect to the metal layer 112 through an adhesion layer 114 that may aid in the connection of dissimilar materials. The adhesion layer 114 may comprise, for example, a metal-doped $Ge_2Se_3$ layer, such as Ag-doped $Ge_2Se_3$, Cu-doped $Ge_2Se_3$, or another suitable material. The second conductor 116 may comprise the same material as the first conductor 106, the same material as the metal layer 112, or may comprise, for example, copper, silver, aluminum, tungsten, or another suitable conductive material.

In embodiments of the CVR 100 that do not comprise a metal layer 112 the second conductor 116 may be fabricated directly over the second chalcogenide layer 110. Alternatively, the second conductor 116 may connect to the second chalcogenide layer 110 through an adhesion layer 114.

The second conductor 116 may connect to further conductive elements or circuitry, such as a voltage plane, a ground plane, a voltage supply, a driver circuit, a difference amplifier, a sense amplifier, or to other suitable circuitry.

A second insulative layer 118 is also shown in FIG. 3. The second insulative layer 118 may fill the spaces that are above and/or to the sides of the layers 106 through 116 of the CVR 100. The insulative layer 118 may encapsulate the CVR 100. The fill layer 118 may act to physically support the CVR 100 and may act to isolate the layers of the CVR 100. For example, the fill layer 118 may act to reduce effects from electric fields that may be produced from or near the CVR 100.

As mentioned previously, some of the layers are optional and may be changed or omitted. For example, the first insulative layer 104 and/or the adhesion layer 114 may be omitted, depending on the materials and/or process that is used to fabricate the CVR 100. In another example, some or all of the metal of the metal layer 112 may be integrated into, or interspersed within, the second chalcogenide layer 110 at the time of fabrication. Integration into the second chalcogenide layer 110 may occur by, for example, sputtering, photo diffusion, thermal diffusion, annealing, or another suitable process. Thus, in some embodiments, the metal layer 112 may be reduced in thickness or omitted.

Figure 1:
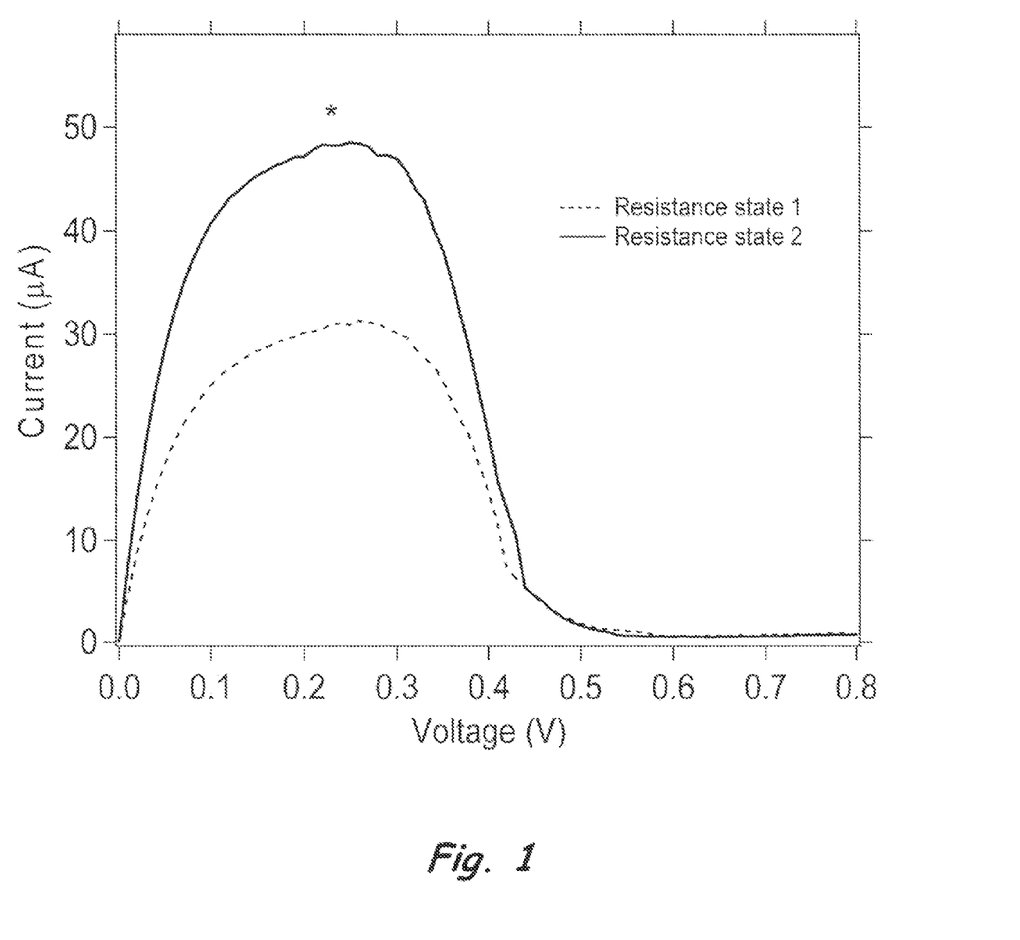
FIG. 1 is a graph of current vs. voltage for two different resistance states for an embodiment of a continuously variable resistor.

Some embodiments of a CVR 100 can be forced, via application of an electrical pulse, to operate in a mode whereby they exhibit an NDR IV (current versus voltage) response. FIG. 1 shows a set of IV response curves measured from an embodiment of a CVR 100 displaying NDR behavior. The CVR 100, which may have a diameter of less than about 0.13 micrometers, has been forced into an NDR mode by application of an electric signal, such as one or more voltage pulses. The time of the electric signal may be less than about 10 ns. The amplitude of the electric signal may be less than about 1 volt.

Additionally, the resistance value of a CVR 100 can be programmed to a plurality of different values, for example, by applying a sequence of voltage pulses. The amplitude, time, and number of voltage pulses, among other variable parameters, can be advantageously adjusted to program a resistance value or resistance state of the CVR 100.

Referring again to FIG. 1, two IV curves are illustrated on a graph, representing two different responses of the CVR 100. A first resistance state ("RS1") and a second resistance state ("RS2") are represented by two IV curves. The first curve ("curve RS1") is associated with RS1 and is illustrated with a dotted line. The second curve ("curve RS2") is associated with RS2 and is illustrated with a solid line. Curve RS1 may represent the response of the CVR 100 in a first state, such as an initial state or a default state, among other states.

RS1 and RS2 are associated with substantially distinct resistance values or ranges of resistance values at certain measurement parameters. For example, RS1 and RS2 may be measured at one or more discrete voltages or over a voltage sweep, as illustrated in FIG. 1 by curve RS1 and curve RS2. For the purposes of this disclosure, the term "resistance value" will be used as a general term for resistance values or ranges of resistance values that may be measured from the CVR 100. Beginning at the origin of the graph, curve RS1 shows current increasing approximately linearly with increasing voltage until about 0.1 volts, after which the current begins to increase at a slower rate. At about 0.25 volts, denoted by a *, a peak current is reached. Curve RS1 shows a peak current of about 30 micro-amps. The voltage value at the current peak may mark a convenient measurement point. After the current peak, the current begins to decrease as voltage increases, thus exhibiting NDR behavior in the CVR 100.

Curve RS2 represents the response of the CVR 100 when set to RS2. The resistance value represented by RS2 may be changed from resistance value represented by RS1 by, for example, pulsing the device with five pulses of about 400 millivolts. Each pulse may persist for about 8 nanoseconds. As shown by curve RS2, the current through CVR 100 increases approximately linearly with the voltage until about 0.1 volts, after which the current increases at a slower rate. The current reaches a peak of about 48 microamps at about 0.25 volts, which is about 18 micro-amps greater than the peak current through the CVR 100 when set to RS1. After the current peak, curve RS2 illustrates a decreasing current with an increase in voltage, thus exhibiting the same general NDR behavior as illustrated by curve RS1.

Curve RS1 and curve RS2 have the same general shape and illustrate the same general behavior, with a substantial difference in the peak current within a range of voltages (i.e., the resistance of the CVR 100 is different at least within the range of voltages). RS2 may represent a substantially lower resistance than RS1. The CVR 100 may achieve additional resistance states with the application of additional voltage pulses.

Figure 2:
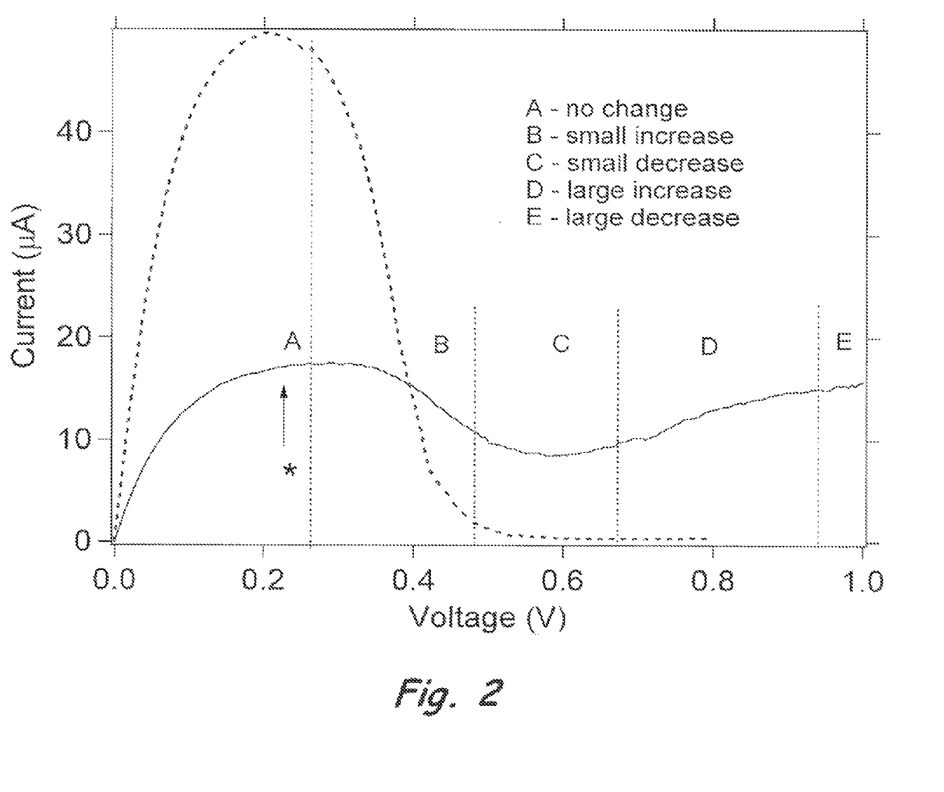
FIG. 2 is another graph of current vs. voltage for two different resistance states for an embodiment of a continuously variable resistor.

FIG. 2 shows another set of IV response curves measured from an embodiment of a CVR 100 displaying NDR behavior. FIG. 2 shows curve RS3, illustrated as a solid line, and curve RS4, illustrated as a dotted line. Curve RS3 and curve RS4 correspond to two distinct resistance states, RS3 and RS4, respectively. RS3 and RS4 may be substantially different than the resistance states, RS1 and RS2, illustrated by FIG. 1.

FIG. 2 has an additional overlay of 5 distinct regions, which are labeled regions A through E. In the embodiment illustrated by FIG. 2, region A corresponds to a voltage range of zero volts to about 0.28 volts, region B corresponds to a voltage range of about 0.28 volts to about 0.49 volts, region C corresponds to a voltage range of about 0.49 volts to about 0.67 volts, region D corresponds to a voltage range of about 0.67 volts to about 0.94 volts, and region E corresponds to a voltage range of greater than about 0.94 volts. Regions A-E are defined by the behavior of the CVR 100 within the regions, rather than by the example voltage ranges marked and enumerated in FIG. 2 and in the above description. Some embodiments of a CVR 100 may have different voltage ranges associated with each region, as would be apparent to one of ordinary skill in the art, given the benefit of this disclosure.

The regions illustrated in FIG. 2 illustrate the influence of the amplitude of a voltage pulse on an increase or decrease of a resistance value of an embodiment of a CVR 100. When a pulse with a potential difference (voltage) value corresponding to a value within region A is applied to the CVR 100, the resistance of the CVR 100 does not change. This can be confirmed by measuring the resistance of the CVR 100 after applying the region A voltage pulse. Thus, the resistance of the CVR 100 is persistent and non-volatile when operated at suitable voltages, such as at voltages that are lower than the maximum voltage value in region A. Also, the resistance of the CVR 100 does not change when a voltage is removed from the CVR 100 (i.e., the CVR 100 "remembers" its resistance state). As such, a voltage with a value corresponding to region A can be applied to the CVR 100 to measure or "read" the resistance without changing the resistance. Additionally, the CVR 100 may be used in place of a static resistor in a circuit that is operated within the range of voltages defined by region A.

Voltage pulses that are applied to the CVR 100 having amplitudes corresponding to regions B-E will change the resistance value of the CVR 100. A voltage pulse from each region may change the resistance of the CVR 100 in a different way. A voltage pulse applied to the CVR 100 with an amplitude from region B may decrease the resistance by a small amount (small increase in current at a static voltage), such as by less than about 20%. A voltage pulse applied to the CVR 100 with an amplitude from region C may increase the resistance by a small amount (small decrease in current at a static voltage), such as by less than about 20%. A voltage pulse applied to the CVR 100 with an amplitude from region D may decrease the resistance by a large amount (large increase in current at a static voltage), such as by greater than about 80%. A voltage pulse applied to the CVR 100 with an amplitude from region E may increase the resistance by a large amount (large decrease in current at a static voltage), such as by greater than about 80%.

For example, the resistance state of a CVR 100 may be changed from RS3 to RS4 (represented in FIG. 2 by curve RS3 and curve RS4) by applying a voltage pulse from region B or region D to the CVR 100. Alternatively, the resistance state of a CVR 100 may be changed from RS3 to RS4 by applying a plurality of voltages pulses from region B or region D to the CVR 100. Further, the resistance state of a CVR 100 may be changed from RS4 to RS3 by applying one or more voltage pulse from region B or region D to the CVR 100.

Figure 4A:
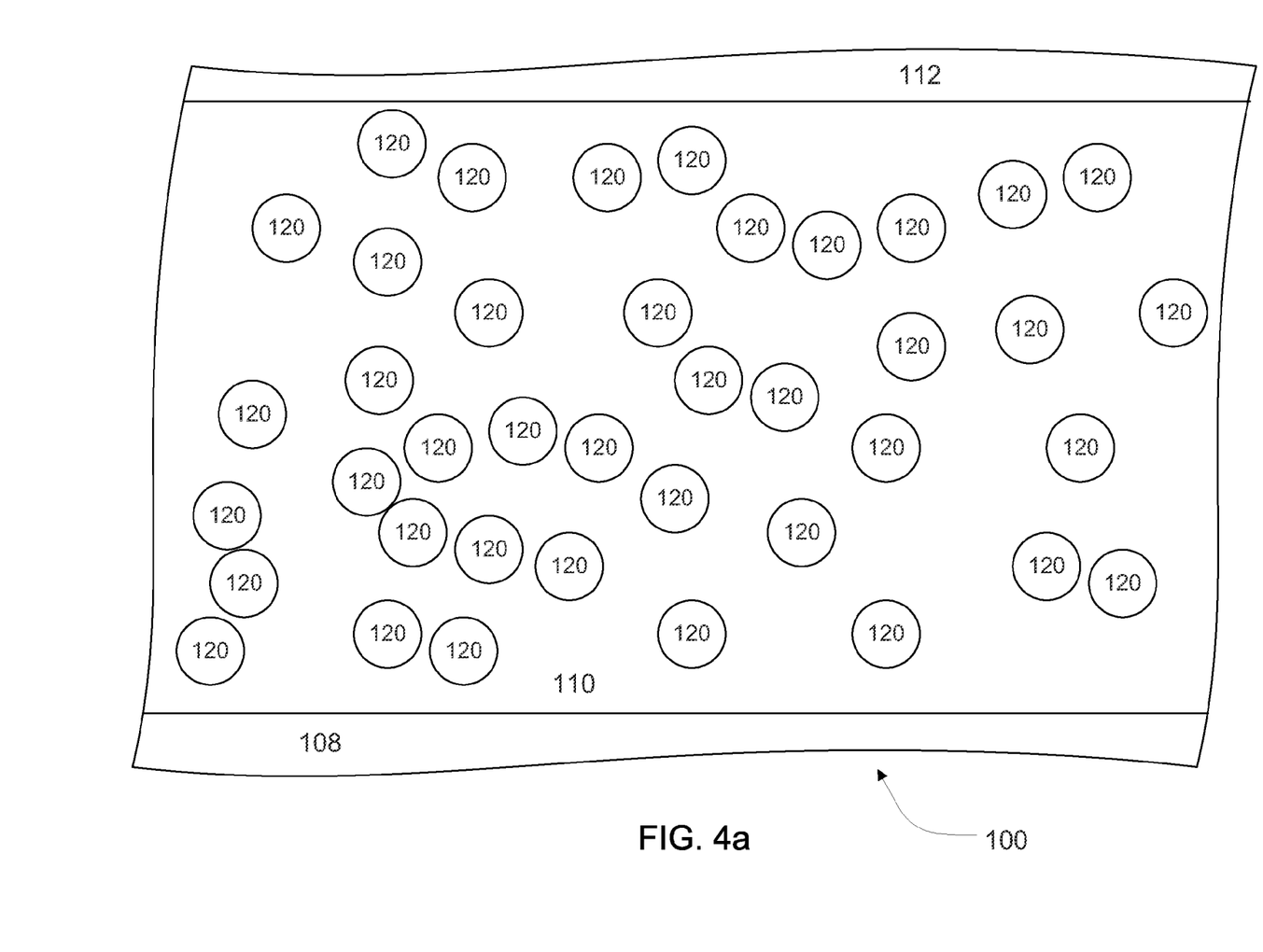
FIG. 4a is a close up view of a metal rich chalcogenide layer.

FIG. 4a shows a cut-away close up view of the second chalcogenide layer 110, which is positioned between a metal layer 112 and a first chalcogenide layer 108. As shown in FIG. 4a, small clusters of metal ("quantum dots") 120 have been introduced into the second chalcogenide layer 110, forming a metal-rich layer. The quantum dots 120 may comprise metals such as silver (Ag), gold (Au), copper (Cu), and/or other suitable metals. The metal can be introduced to the second chalcogenide layer 110 at the time of fabrication, such as by sputtering, vapor deposition, annealing, or by other suitable known methods of fabrication.

Alternatively, the metal layer 112 may be fabricated over the second chalcogenide layer 110 prior to metal being introduced into the second chalcogenide layer 110. During a subsequent step, metal from the metal layer 112 may be moved into the second chalcogenide layer 110, forming a solid solution and making the second chalcogenide layer 110 a metal-rich layer. The metal may be moved into the second chalcogenide layer 110 by a suitable method, such as, for example, by annealing, by applying a voltage to the CVR 100.

Referring again to FIG. 4a, because the quantum dots 120 have been interspersed with the second chalcogenide layer 110, the CVR 100 may exhibit NDR behavior. Additionally, the quantum dots 120 may conduct electrons through quantum tunneling. Thus, the CVR 100 may have an effective resistance that is defined by parameters of the tunneling effect induced in the CVR 100 by the quantum dots 120. As such, the CVR 100 illustrated by FIG. 4a is set to a first resistance state, though the quantum dots do not form a conductive path though the second chalcogenide layer 110.

Figure 4B:
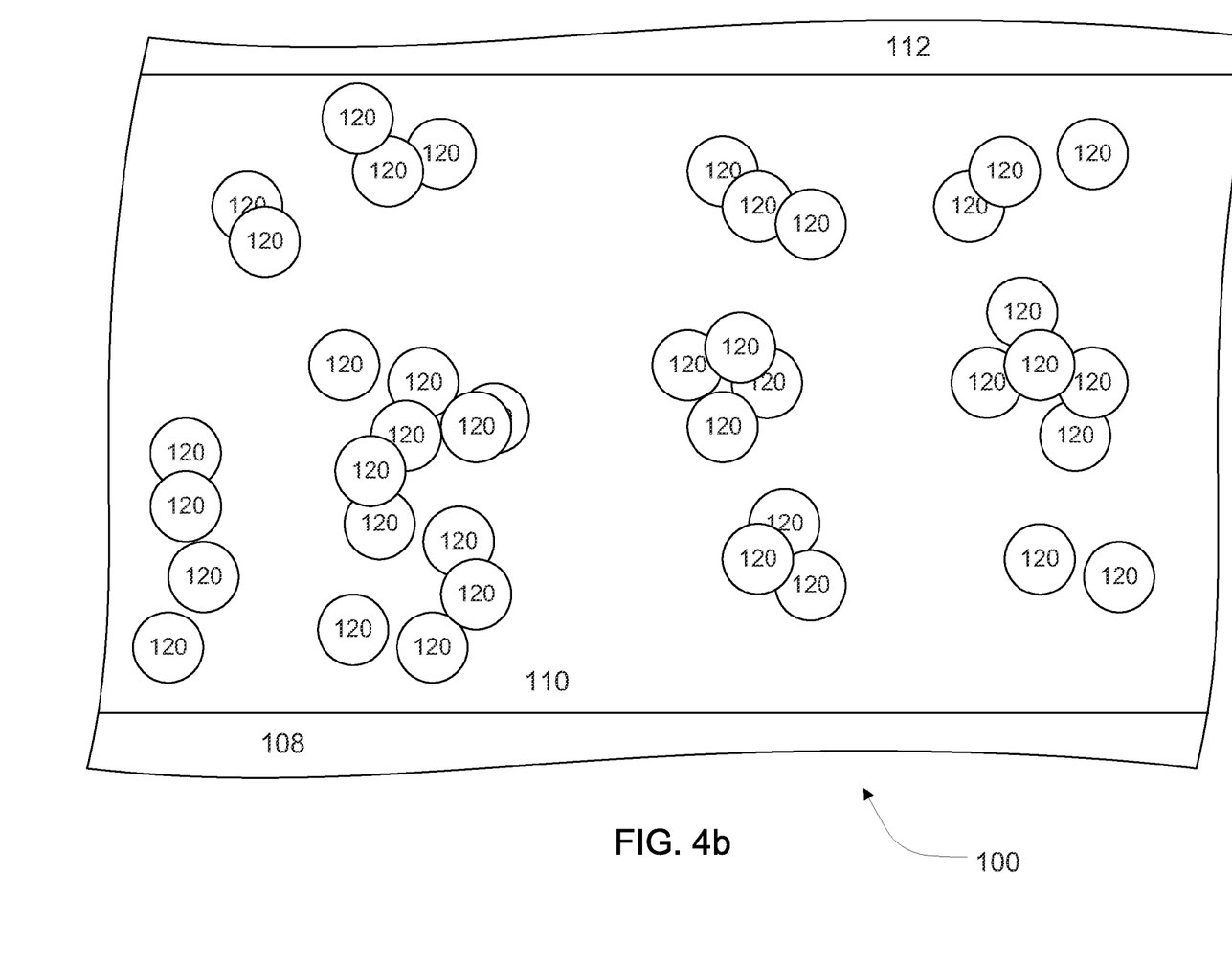
FIG. 4b is a close up view of the metal rich chalcogenide layer of FIG. 4a, which has been programmed to a second resistance state.

FIG. 4b shows the CVR 100 in a second resistance state. The resistance state may have been programmed into the CVR 100 by one or more voltage pulses, such as with one or more voltage pulses that correspond to voltage amplitudes defined by regions C and/or E, shown in FIG. 2. As can be seen in FIG. 4b, the quantum dots 120 are distributed about the second chalcogenide layer 110 in a different distribution than shown in FIG. 4a. The metal 120 is generally distributed about the second chalcogenide layer 110 in larger groups, increasing the average space between each quantum dot 120. Electrons move through the second chalcogenide layer 110 through quantum tunneling. Quantum tunneling is reduced by increased distance. Thus, the resistance of the CVR 100 in the second resistance state shown in FIG. 4b is higher than the resistance in the first resistance state, shown in FIG. 4a.

Figure 4C:
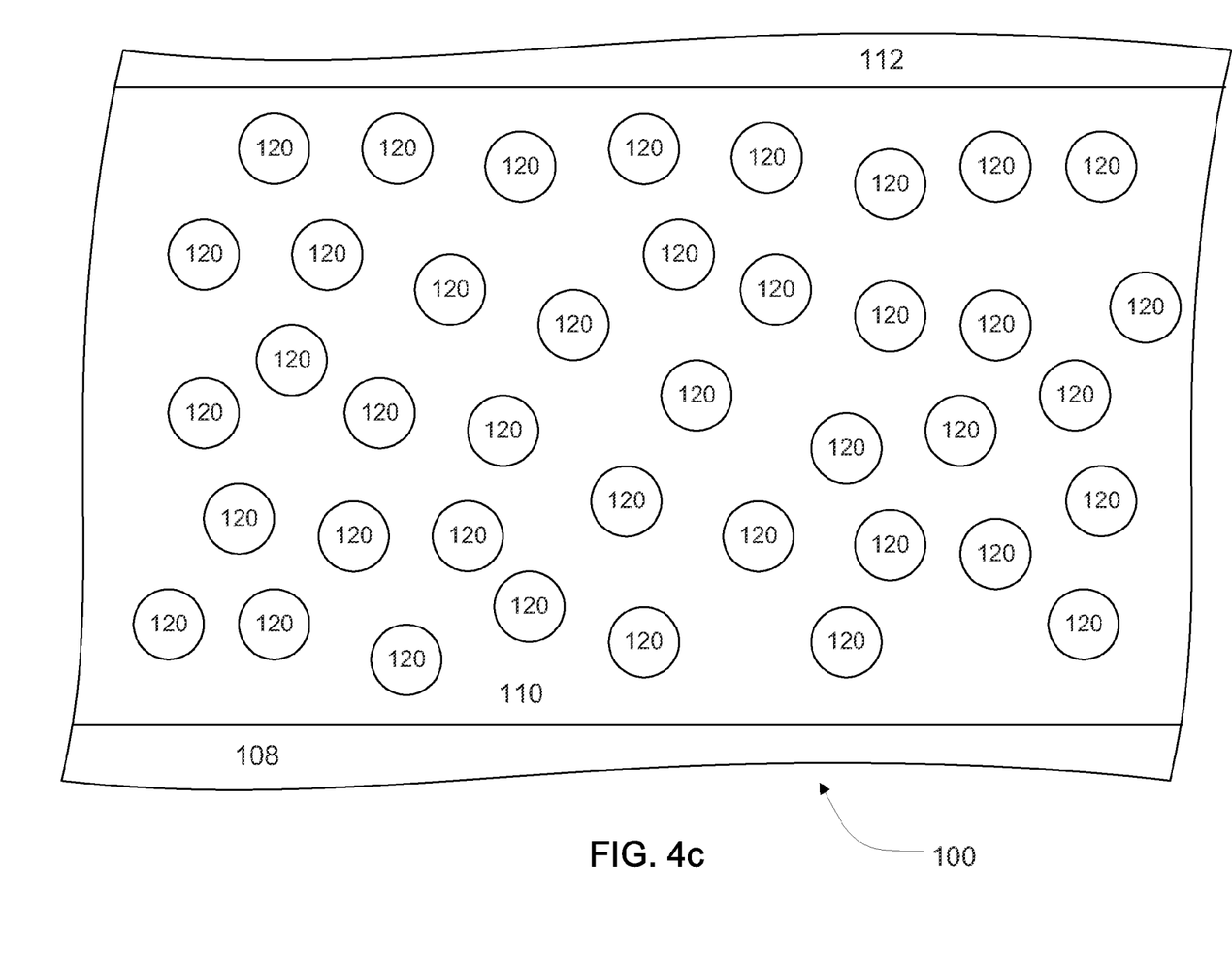
FIG. 4c is a close up view of the metal rich chalcogenide layer of FIG. 4a, which has been programmed to a third resistance state.

FIG. 4c shows the CVR 100 in a third resistance state. The resistance state may have been programmed into the CVR 100 by one or more voltage pulses, such as with one or more voltage pulses that correspond to voltage amplitudes defined by regions B and/or D (see FIG. 2). As can be seen in FIG. 4c, the quantum dots 120 are distributed about the second chalcogenide layer 110 in a different distribution than shown in FIG. 4a or FIG. 4b. The quantum dots 120 may be generally distributed about the second chalcogenide layer 110 in smaller, more evenly spaced groups. Grouping the quantum dots into smaller groups decreases the average distance between each quantum dot and increases the likelihood of electron conduction through quantum tunneling. Thus, the resistance of the CVR 100 in the third resistance state shown in FIG. 4c is lower than the resistance of the first resistance state, shown in FIG. 4a.

Multiple pulses applied in each potential (voltage) region, shown in FIG. 2, have a cumulative effect on the resistance, as may be seen by measuring a peak current at a suitable voltage, such as at about 0.25 V. For example, applying ten voltage pulses with a specific set of properties, such as amplitude and/or width, to the CVR 100 may change the resistance of the CVR 100 by ten times the change that may occur by applying one pulse with the same properties. Further, a plurality of small changes, resulting from an accumulation of small voltage pulses, may have the same effect as a large voltage pulse. For example, applying ten voltage pulses from region B may have a substantially similar effect on the CVR 100 as one applied voltage pulse from region D.

Additionally, the voltage selected from within a voltage range, such as region B, C, D, or E, may affect the size of the resistance adjustment. Also, by combining voltage pulses from different voltage regions, the resistance may be adjusted coarsely, then adjusted finely to tune the CVR 100 to a desired resistance value or resistance state.

A change in resistance to an embodiment of a CVR 100 is predictable and repeatable. A voltage pulse applied to the CVR 100 with a given set of parameters will change the resistance of the CVR 100 in substantially the same way each time it is applied, given the same conditions. Because of the predictable nature of the CVR 100 and the ability of the CVR 100 to "remember" the resistance value that it currently has (i.e., the current resistance state), the CVR 100 may be set to a specific chosen resistance value by a user. For example, if a resistance value of about 750 ohms is desired, but the current resistance value of an embodiment of a CVR 100 is about 2,000 ohms, one or more specific voltage pulses from regions C and/or E may be applied to the CVR 100 to bring the resistance value down the desired level of about 750 ohms.

In another example, if a resistance value of 750 ohms is desired, but the current resistance value of an embodiment of a CVR 100 is not known, the current resistance value of the CVR 100 may be measured by a measurement circuit. The measured resistance value (i.e., the current resistance value) may be used to set the resistance of the CVR 100 to the desired value (i.e., the next resistance value). The desired resistance value of the CVR 100 may be set by, for example, selecting a pre-set number of voltage pulses, such as, for example, from a look up table and applying the pre-set number of voltage pulses.

Further, because the resistance of a CVR 100 is non-volatile and also may be measured without affecting it, the CVR 100 may be used with a resistance measurement circuit to ensure accuracy. For example, the CVR 100 may be used with a resistance measurement feedback circuit that iteratively measures the resistance and iteratively adjusts the CVR 100 to a next resistance state. An iterative adjustment may make the CVR 100 as accurate as time constraints allow it to be. Additionally, a continuous iterative adjustment may enable the resistance of the CVR 100 to be adjusted as one or more real world conditions change (e.g., temperature).

A circuit that has a suitable operable voltage, such as within the range of voltages defined by region A, as illustrated by FIG. 2, may use a CVR 100 in place of a standard resistor. For example, many circuits use resistors to adjust the drive of an output or to pull a signal line high or low. If a circuit is connected using a breadboard, many different resistors can be physically interchanged to find a value that will yield a suitable drive or pullup/pulldown strength. However, if the circuit is built in permanent or semi-permanent form, such as on a printed circuit board, printed circuit assembly, integrated circuit, application specific integrated circuit ("ASIC"), or other such permanent form, physically changing an element such as a resistor may be difficult or impossible. In this case, an embodiment of a CVR 100 may replace a resistor and may advantageously enable adjustments to the resistance of the circuit.

In another example, a circuit may use a signal, such as high voltage, from a transistor to enable a region of circuitry, such as when a CPU transitions from a power save mode to a more active mode. Generally, transistors require a constant voltage to be applied to the gate. In this example, an embodiment of a CVR 100 may be advantageously used to replace the transistor, enabling the region of circuitry, such as with a high voltage signal when the resistance of the CVR 100 is at a low value, or disabling the region of circuitry, such as with a low voltage signal when the resistance of the CVR 100 is at a high value. The passive nature of the CVR 100 means that the CVR 100 does not require a constant controlling voltage. The enabling resistance may be set by an initial voltage pulse or set of voltage pulses, as described previously. A pullup or pulldown resistor may be used by a circuit comprising the CVR 100.

An embodiment of a CVR 100 may be used to make a circuit more power efficient. For example, a differential amplifier may use a biasing element on a common connection to adjust the amount of current flowing through each leg of the circuit. The biasing element may be a transistor that is controlled by additional circuitry, in parallel with the differential amplifier, which applies a constant voltage to the transistor gate to adjust to resistance of the transistor and thus the current through the transistor. Typically, the resistance of the transistor is adjusted in response to a change in input to the differential amplifier. A CVR 100 could be used in substantially the same way, changing the resistance in response to a change in input, but without the need for a constant signal to be input to the CVR 100.

Although the continuously variable resistor is described in terms of certain preferred embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, and that many circuits that utilize the concept of this continuously variable resistor can be designed and fabricated, including those that optimize the programming of and the use of the programmable resistor, without departing from the spirit and scope of the present disclosure.

What is claimed is:

1. A method of programming a continuously variable resistor comprising a first electrode connected to a first chalcogenide layer, the first chalcogenide layer connected to a second chalcogenide layer having metal interspersed therein and thus making the second chalcogenide layer a metal-rich chalcogenide layer, and a second electrode electrically connected to the second chalcogenide layer, and wherein the continuously variable resistor has a resistance value that is variable, the method comprising:

configuring the continuously variable resistor to have a negative differential resistance behavior, the continuously variable resistor being set to a first resistance state;

applying a first voltage pulse within a first voltage potential range to the continuously variable resistor to change the resistance state of the continuously variable resistor from the first resistance state to a second resistance state, and wherein the change in resistance from the first resistance state to the second resistance state corresponds to a small decrease in resistance of approximately 20%; and applying a second voltage pulse within a second voltage potential range to the continuously variable resistor to change the resistance state of the continuously variable resistor from the second resistance state to a third resistance state, and wherein the change in resistance from the second resistance state to the third resistance state corresponds to a small increase in resistance of approximately 20%.

2. The method of programming a continuously variable resistor of claim 1, further comprising measuring the resistance value of the continuously variable resistor a first time, prior to applying the first voltage pulse.

3. The method of programming a continuously variable resistor of claim 2, further comprising adjusting the first voltage pulse prior to applying the first voltage pulse at least partly based on the first measured resistance value of the continuously variable resistor.

4. The method of programming a continuously variable resistor of claim 3, wherein the adjustment to the first voltage pulse comprises a change in the voltage amplitude.

5. The method of programming a continuously variable resistor of claim 3, wherein the adjustment to the first voltage pulse comprises a change in the length of the voltage pulse.

6. The method of programming a continuously variable resistor of claim 2, further comprising measuring the resistance value of the continuously variable resistor a second time, prior to applying the second voltage pulse and subsequent to applying the first voltage pulse.

7. The method of programming a continuously variable resistor of claim 4, further comprising adjusting the second voltage pulse prior to applying the second voltage pulse at least partly based on the second measured resistance value of the continuously variable resistor.

8. The method of programming a continuously variable resistor of claim 1, wherein a positive voltage pulse increases the resistance value of the continuously variable resistor.

9. The method of programming a continuously variable resistor of claim 1, wherein a positive voltage pulse decreases the resistance value of the continuously variable resistor.

10. The method of claim 1 further comprising:
applying a third voltage pulse within a third voltage potential range to the continuously variable resistor to change the resistance state of the continuously variable resistor from the third resistance state to a fourth resistance state, and wherein the change in resistance from the third resistance state to the fourth resistance state corresponds to a large decrease in resistance of approximately 80%; and
applying a fourth voltage pulse within a fourth voltage potential range to the continuously variable resistor to change the resistance state of the continuously variable resistor from the fourth resistance state to a fifth resistance state, and wherein the change in resistance from the fourth resistance state to the fifth resistance state corresponds to a large increase in resistance of approximately 80%.

11. The method of claim 1 wherein metal is interspersed into the second chalcogenide layer during the fabrication process.

12. The method of claim 1 wherein metal is interspersed into the second chalcogenide layer by annealing the continuously variable resistor.

13. The method of claim 1 wherein a metal layer is connected to the second chalcogenide layer, and further wherein the metal layer comprises a metal to be interspersed into the second chalcogenide layer.

14. The method of claim 1 further comprising:
measuring the resistance value of the continuously variable resistor;
comparing the resistance value of the continuously variable resistor with an expected value; and
adjusting the resistance value of the continuously variable resistor by applying an adjustment voltage pulse within one of the first or second voltage pulse ranges.

15. A method of programming a continuously variable resistor comprising a first electrode connected to a first chalcogenide layer, the first chalcogenide layer connected to a second chalcogenide layer having metal interspersed therein and thus making the second chalcogenide layer a metal-rich chalcogenide layer, a second electrode electrically connected to the second chalcogenide layer, a resistance measurement feedback circuit coupled to the first and second electrodes, and wherein the continuously variable resistor has a resistance value that is variable, the method comprising:
configuring the continuously variable resistor to have a negative differential resistance behavior, the continuously variable resistor being set to a first resistance state;
applying a first voltage pulse within a first voltage potential range to set the continuously variable resistor to a second resistance state, and wherein the difference between the first resistance state and the second resistance state corresponds to a small decrease in resistance of approximately 20%;
applying a second voltage pulse within a second voltage potential range to set the continuously variable resistor to a third resistance state, and wherein the difference between the second resistance state and the third resistance state corresponds to a small increase in resistance of approximately 20%;
applying a third voltage pulse within a third voltage potential range to set the continuously variable resistor to a fourth resistance state, and wherein the difference between the third resistance state and the fourth resistance state corresponds to a large decrease in resistance of approximately 80%; and
applying a fourth voltage pulse within a fourth voltage potential range to set the continuously variable resistor to a fifth resistance state, and wherein the difference between the fourth resistance state and the fifth resistance state corresponds to a large increase in resistance of approximately 80%.

16. The method of claim 15 further comprising:
measuring the resistance value of the continuously variable resistor with the resistance measurement feedback circuit;
comparing the resistance value of the continuously variable resistor; and
adjusting the resistance value of the continuously variable resistor.

* * * * *